(12) United States Patent
Noguchi et al.

(10) Patent No.: US 11,066,757 B2
(45) Date of Patent: Jul. 20, 2021

(54) DIAMOND SUBSTRATE AND FREESTANDING DIAMOND SUBSTRATE

(71) Applicants: SHIN-ETSU CHEMICAL CO., LTD., Tokyo (JP); National Institute of Advanced Industrial Science and Technology, Tokyo (JP); NATIONAL UNIVERSITY CORPORATION KANAZAWA UNIVERSITY, Kanazawa (JP)

(72) Inventors: Hitoshi Noguchi, Takasaki (JP); Shozo Shirai, Takasaki (JP); Toshiharu Makino, Tsukuba (JP); Masahiko Ogura, Tsukuba (JP); Hiromitsu Kato, Tsukuba (JP); Hiroyuki Kawashima, Tsukuba (JP); Daisuke Kuwabara, Tsukuba (JP); Satoshi Yamasaki, Tsukuba (JP); Daisuke Takeuchi, Tsukuba (JP); Norio Tokuda, Kanazawa (JP); Takao Inokuma, Kanazawa (JP); Tsubasa Matsumoto, Kanazawa (JP)

(73) Assignees: Shin-Etsu Chemical Co., Ltd., Tokyo (JP); National Institute of Advanced Industrial Science and Technology, Tokyo (JP); National University Corporation Kanazawa University, Kanazawa (JP)

( * ) Notice: Subject to any disclaimer, the term of this patent is extended or adjusted under 35 U.S.C. 154(b) by 240 days.

(21) Appl. No.: 16/179,363

(22) Filed: Nov. 2, 2018

(65) Prior Publication Data
US 2019/0093253 A1    Mar. 28, 2019

Related U.S. Application Data

(62) Division of application No. 15/445,134, filed on Feb. 28, 2017, now Pat. No. 10,253,426.

(30) Foreign Application Priority Data

Feb. 29, 2016  (JP) .............................. JP2016-037175

(51) Int. Cl.
 C30B 29/04          (2006.01)
 C30B 25/04          (2006.01)
   (Continued)

(52) U.S. Cl.
 CPC ............ *C30B 25/04* (2013.01); *C30B 25/186* (2013.01); *C30B 25/20* (2013.01); *C30B 29/04* (2013.01);
   (Continued)

(58) Field of Classification Search
 CPC ................................ C30B 25/20; C30B 29/04
   (Continued)

(56) References Cited

U.S. PATENT DOCUMENTS 4,925,701 A    5/1990  Jansen et al.
5,242,711 A    9/1993  DeNatale et al.
   (Continued)

FOREIGN PATENT DOCUMENTS

CN    1632186 A    6/2005
CN    102031561 A    4/2011
   (Continued)

OTHER PUBLICATIONS

Umezawa, Hitoshi et al; "Device scaling of psuedo-vertical diamond power Schottky barrier diodes;" Diamond & Related Materials; Apr. 2009; vol. 18; pp. 1196-1199.
   (Continued)

*Primary Examiner* — Archene A Turner
(74) *Attorney, Agent, or Firm* — Oliff PLC

(57) ABSTRACT

A method for manufacturing a diamond substrate, including: a first step of preparing patterned diamond on a foundation
   (Continued)

surface, a second step of growing diamond from the patterned diamond prepared in the first step to form the diamond in a pattern gap of the patterned diamond prepared in the first step, a third step of removing the patterned diamond prepared in the first step to form a patterned diamond composed of the diamond formed in the second step, and a fourth step of growing diamond from the patterned diamond formed in the third step to form the diamond in a pattern gap of the patterned diamond formed in the third step. There can be provided a method for manufacturing a diamond substrate which can sufficiently suppress dislocation defects, a high-quality diamond substrate, and a freestanding diamond substrate.

4 Claims, 4 Drawing Sheets

(51) Int. Cl.
| | | |
|---|---|---|
| | *H01L 21/02* | (2006.01) |
| | *C30B 25/18* | (2006.01) |
| | *C30B 25/20* | (2006.01) |
| | *H01L 29/16* | (2006.01) |
| | H01L 21/3065 | (2006.01) |
| | H01L 21/308 | (2006.01) |

(52) U.S. Cl.
CPC .... *H01L 21/0262* (2013.01); *H01L 21/02376* (2013.01); *H01L 21/02527* (2013.01); *H01L 29/1602* (2013.01); H01L 21/02057 (2013.01); H01L 21/02085 (2013.01); H01L 21/3065 (2013.01); H01L 21/3086 (2013.01)

(58) Field of Classification Search
USPC ........................................................ 428/408
See application file for complete search history.

(56) References Cited

U.S. PATENT DOCUMENTS

| | | | |
|---|---|---|---|
| 5,552,345 A | | 9/1996 | Schrantz et al. |
| 5,614,019 A | * | 3/1997 | Vichr ................ C30B 25/02 117/84 |
| 5,686,152 A | | 11/1997 | Johnson et al. |
| 5,989,511 A | | 11/1999 | Gruen et al. |
| 2004/0052946 A1 | | 3/2004 | Burmeister et al. |
| 2004/0206299 A1 | | 10/2004 | Tadatomo et al. |
| 2010/0052112 A1 | | 3/2010 | Rogers et al. |
| 2011/0081531 A1 | | 4/2011 | Noguchi |
| 2012/0047950 A1 | | 3/2012 | Grotjohn et al. |
| 2012/0288698 A1 | | 11/2012 | Moldovan et al. |
| 2014/0094035 A1 | | 4/2014 | Ji et al. |
| 2017/0247814 A1 | | 8/2017 | Noguchi et al. |

FOREIGN PATENT DOCUMENTS

| | | | |
|---|---|---|---|
| CN | 104651928 A | | 5/2015 |
| CN | 104724664 A | | 6/2015 |
| CN | 104775154 A | | 7/2015 |
| EP | 0 612 868 A1 | | 8/1994 |
| EP | 0745707 A1 | | 12/1996 |
| EP | 1052684 A1 | | 11/2000 |
| EP | 1184897 A1 | | 3/2002 |
| EP | 3181736 A1 | | 6/2017 |
| GB | 2228745 A | | 9/1990 |
| JP | H06-247793 A | | 9/1994 |
| JP | 2010-222172 | * | 10/2010 |
| TW | 201411776 A | | 3/2014 |
| WO | 2015/197632 A1 | | 12/2015 |
| WO | 2016/024564 A1 | | 2/2016 |

OTHER PUBLICATIONS

Sawabe, Atsuhito et al; "Growth of Heteroepitaxial Diamond on Iridium by Patterned Nucleation and Growth Method;" Japanese Association for Crystal Growth; Dec. 2012; vol. 29; pp. 179 to 184.
Ohtsuka Kazuki et al; "Epitaxial Growth of Diamond on Iridium;" Japanese Journal of Applied Physics; Aug. 1996; vol. 35; pp. L1072-L1074.
Ichikawa, Kimiyoshi et al; "Defect examination of epitaxial diamond by etch put method~Effect of etching temperature on etch pit formation~;" 24th NDF-Dia. Sympo.; 2010; pp. 226-227.
Yamada et al; "A 2-in. mosaic wafer made of a single-crystal diamondy;" Applied Physics Letters; 2014; vol. 104; pp. 1-4.
Jul. 18, 2017 Partial European Search Report issued in European Patent Application No. EP 17 00 0294.
Oct. 12, 2017 Search Report issued in European Patent Application No. 17000294.3.
Fox, N.A., et al., "Patterned diamond particle films". Journal of Applied Physics, vol. 87, No. 11, Jun. 1, 2000, pp. 8187-8191.
Ando, Yutaka, et al., "Expitaxial Lateral Overgrowth of Diamonds on Iridium by Patterned Nucleation and Growth Method". Japanese Journal of Applied Physics 51 (2012) 090101, pp. 1-5.
Tong, Wei, et al., "Fabrication of planarised conductively patterned diamond for bio-applications". Materials Science and Engineering C 43 (2014) 135-144.
Tong, Wei, et al., "Design of a patterned diamond substrate for ordered neural cell adhesion". Procedia Technolody 20 (2015) 206-211.
Jul. 8, 2020 Office Action issued in Chinese Patent Application No. 201710106146.8 (with partial translation).
Sep. 15, 2020 Office Action issued in European Patent Application No. 17000294.3.
Francis et al., "Formation and characterization of 4-inch GaN-on-diamond substrates," Diamond & Related Materials vol. 19, No. 2-3, pp. 229-233, Feb. 1, 2010.
Dec. 22, 2020 Notification of Reasons for Refusal issued in Japanese Patent Application No. 2020-007853.
Jan. 6, 2021 Office Action issued in Taiwanese Patent Application No. 106106033.
Jan. 19, 2021 Office Action issued in Chinese Patent Application No. 201710106146.8.

* cited by examiner

DIAMOND SUBSTRATE AND FREESTANDING DIAMOND SUBSTRATE

This is a Division of Application Ser. No. 15/445,134 filed Feb. 28, 2017, which claims the benefit of Japanese Patent Application No. 2016-037175 filed Feb. 29, 2016. The disclosure of the prior applications is hereby incorporated by reference herein in its entirety.

TECHNICAL FIELD

The present invention relates to a method for manufacturing a diamond substrate, a diamond substrate, and a freestanding diamond substrate.

BACKGROUND ART

Diamond has a wide band gap of 5.47 eV at room temperature, and is known as a wide bandgap semiconductor.

Among semiconductors, diamond has extremely high dielectric breakdown electric field strength of 10 MV/cm, and a high-voltage operation can be performed. Moreover, diamond has the highest thermal conductivity among known materials, and has an excellent heat radiation property thereby. Further, diamond has very large carrier mobility and saturated drift velocity, and is suitable for a high speed device.

Accordingly, diamond has the highest Johnson performance index, which indicates a property as a radio-frequency and high power device, compared to semiconductors such as silicon carbide and gallium nitride, and is said to be an ultimate semiconductor thereby.

As described above, diamond is expected to be practically used as a semiconductor. It has been desired to supply a large-area and high-quality diamond substrate. However, a diamond substrate with sufficient quality has not been obtained yet.

Currently, Ib type diamond synthesized by a High Pressure and High Temperature (HPHT) method is used as one of a diamond substrate. This Ib type diamond, however, contains many nitrogen impurities, and can only be obtained in a size of about 8 mm square at maximum, thereby being less practical.

Non-Patent Document 1 produces a Schottky diode by using diamond synthesized by a HPTP method as a substrate. This diamond substrate, however, has an etch-pit density by hydrogen plasma treatment, which is a measure of a dislocation defect density, of approximately $10^5$ cm$^{-2}$. This is reported to be causing operation failure when it is actually formed into an electrode and tried to operate since it contains a killer defect in the vicinity of the electrode or a current path.

In some cases, a homoepitaxial diamond, which was epitaxially grown by a Chemical Vapor Deposition (CVD) method using a diamond synthesized by a HPHT method as a foundation, is used as a substrate.

Non-Patent document 2 tried to produce a mosaic diamond substrate in which plural of diamond substrates are bound in order to obtain a large diamond substrate. Such an art, however, is liable to generate cracks along with the boundary of the substrate.

On the other hand, it has been investigated to produce a diamond substrate by heteroepitaxial growth, in which diamond is grown on the other material. By heteroepitaxial growth, it is possible to obtain a large-area substrate relatively easily, and to reduce the production cost.

As a foundation for heteroepitaxial growth of diamond, silicon (Si), platinum (Pt), etc. have been investigated previously. Non-Patent Document 3 reported that iridium (Ir) is suitable for the foundation material. This is an art to use Ir epitaxially grown on the surface of a single crystal magnesium oxide (MgO) as a foundation material, to subject the surface to treatment for generating a diamond nuclei, and to produce epitaxial diamond by a direct current plasma CVD method.

In heteroepitaxial growth, however, many dislocation defects are generated due to lattice mismatch between diamond and the foundation material. For example, there is large lattice mismatch of 7% between diamond (lattice parameter: 3.57 Å) and Ir (lattice parameter: 3.84 Å). Non-Patent Document 4 reports that an etch-pit density of heteroepitaxial diamond rises to $10^8$ cm$^{-2}$.

As a method for reducing such a dislocation defect, Non-Patent Document 5 proposes an art called selective growth process. This is a process of lateral growth of diamond from diamond nuclei formed in arbitrary pattern (ELO: Epitaxial Lateral Overgrowth).

PRIOR ART DOCUMENTS

Non-Patent Documents

Non-Patent Document 1: H. Umezawa et al., Diamond Relat. Mater., 18, 1196 (2009)
Non-Patent Document 2: H. Yamada et al., Appl. Phys. Lett., 104, 102110 (2014)
Non-Patent Document 3: K. Ohtsuka et al., Jpn. J. Appl. Phys., 35, L1072 (1996)
Non-Patent Document 4: K. Ichikawa et al., Proc. 24th NDF-Dia. Sympo., 226 (2010)
Non-Patent Document 5: A. Sawabe et al., J. Jpn. Association for Crystal Growth, 39, 179 (2012)

SUMMARY OF INVENTION

Technical Problem

Although the foregoing selective growth process can reduce dislocation defects to a certain extent, it is necessary to further reduce defects for practical use.

In heteroepitaxial growth, thermal stress is created too due to the difference of thermal expansion coefficient between diamond and the foundation material. For example, each linear expansion coefficient is $1.1 \times 10^{-6}$ K$^{-1}$ in diamond, $13.8 \times 10^{-6}$ K$^{-1}$ in MgO, and $7.1 \times 10^{-6}$ K$^{-1}$ in Ir. Diamond is also known to create large internal stress with the crystal growth. These stress causes generation of cracks or warpage of a diamond substrate.

Actually, many cracks are generated even in a heteroepitaxial diamond substrate produced by a selective growth process described in Non-Patent Document 5. Accordingly, it is difficult to practically use this art as it is.

Accordingly, it has been desired to reduce the thermal stress and the internal stress in order to practically use a diamond substrate prepared by epitaxial growth.

The present invention has been made in view of these circumstances, and it is an object of the present invention to provide a method for manufacturing a diamond substrate which can sufficiently reduce defects (including dislocation defects), a high-quality diamond substrate and a high-quality freestanding diamond substrate with the defects being sufficiently reduced.

Solution to Problem

In order to solve the above problems, the present invention provides a method for manufacturing a diamond substrate, comprising:

a first step of preparing patterned diamond on a foundation surface, a second step of growing diamond from the patterned diamond prepared in the first step to form the diamond in a pattern gap of the patterned diamond prepared in the first step, a third step of removing the patterned diamond prepared in the first step to form a patterned diamond composed of the diamond formed in the second step, and a fourth step of growing diamond from the patterned diamond formed in the third step to form the diamond in a pattern gap of the patterned diamond formed in the third step.

Such a method for manufacturing a diamond substrate can sufficiently reduce defects of a diamond substrate, and can manufacture high-quality diamond.

In this case, the foundation surface can be composed of diamond.

When the foundation surface is composed of diamond, a diamond substrate can be manufactured by homoepitaxial growth.

The foundation surface can be composed of a different kind of material other than diamond such as iridium, rhodium, and platinum.

When the foundation surface is composed of different kind of material, and diamond is heteroepitaxially grown as described above, it is possible to manufacture a high-quality and large-area diamond substrate.

In the inventive method for manufacturing a diamond substrate, it is preferable to remove a foreign substance adhered on a wall of the patterned diamond prepared on the foundation surface in the first step, prior to the second step.

By removing a foreign substance as described above, it is possible to suppress generation of abnormal growth particle in the subsequent second step.

It is also preferable that the patterned diamond be prepared in the first step with a ratio D/W of a depth D to a width W of the pattern gap being 0.1 or more.

When the patterned diamond is prepared so as to have such a ratio (D/W) of a depth D to a width W of the pattern gap in the first step, the pattern gap can be filled relatively early in the second step. Accordingly, even when an abnormal growth particle is generated from the pattern gap, an influence to the formed diamond surface can be reduced.

It is also preferable that the patterned diamond be prepared in the first step with at least a part of a bottom portion of the pattern gap being pierced through.

When the foundation surface is composed of a different kind of material other than diamond, the patterned diamond can also be prepared in the first step with at least a part of a bottom portion of the pattern gap being prepared below the foundation surface.

This makes it possible to manufacture a diamond substrate with the internal stress, which is created as the crystal growth, being relaxed. It is also possible to manufacture a diamond substrate with the thermal stress, which is created when the foundation is composed of a different kind of material, being relaxed.

It is also preferable in the second step that the diamond be grown by using a chemical vapor deposition method.

As described above, in the second step, diamond can be grown by using various chemical vapor deposition methods.

It is also preferable to form a void in the diamond grown in the second step.

By forming a void in diamond as described above, it is possible to relax the internal stress, which is created as the crystal growth, and the thermal stress, which is created when the foundation is composed of a different kind of material, and is preferable thereby.

It is also preferable to remove a foreign substance adhered on a wall of the patterned diamond formed in the third step, prior to the fourth step.

By removing a foreign substance as described above, it is possible to suppress generation of an abnormal growth particle in the subsequent fourth step.

It is also preferable that the patterned diamond be formed in the third step with a ratio D/W of a depth D to a width W of the pattern gap being 0.1 or more.

This makes it possible to fill the pattern gap relatively early in the fourth step. Accordingly, even when an abnormal growth particle is generated from the pattern gap, an influence to the formed diamond surface can be reduced.

It is also preferable that the patterned diamond be formed in the third step with at least a part of the bottom portion of the pattern gap being pierced through.

When the foundation surface is composed of a different kind of material other than diamond, the patterned diamond can also be formed in the third step with at least a part of the bottom portion of the pattern gap being prepared below the foundation surface.

This makes it possible to produce a diamond substrate with the internal stress, which is created as the crystal growth, and the thermal stress, which is created when the foundation is composed of a different kind of material, being relaxed.

It is also preferable in the third step that the diamond formed in the second step be removed in the third step to a position being 5 μm or more and 30 μm or less away from a boundary with the patterned diamond prepared in the first step.

Such a removal of diamond formed in the second step can grow higher quality diamond in the fourth step, and is preferable in view of production efficiency and production cost.

It is also preferable in the fourth step that the diamond be grown by using a chemical vapor deposition method.

As described above, in the fourth step, diamond can be grown by using various chemical vapor deposition methods.

It is also preferable to form a void in the diamond grown in the fourth step.

Such a formation of a void in diamond can relax the internal stress, which is created as the crystal growth, and the thermal stress, which is created when the foundation is composed of a different kind of material, and is preferable thereby.

The present invention also provides a diamond substrate in which at least one surface thereof is composed of diamond, and an inner portion thereof contains a void.

The foregoing diamond substrate can be composed of a foundation and a diamond layer formed on the surface of the foundation, and contains the void on a boundary between the foundation and the diamond layer.

The present invention also provides a freestanding diamond substrate in which one surface thereof contains a void.

Such a diamond substrate containing a void in the inner portion thereof, and a freestanding diamond substrate comprising a void in one surface thereof can be a substrate in which defects such as dislocation defects are sufficiently reduced. Furthermore, the stress is reduced, and warpage of the substrate or generation of a crack can be suppressed thereby.

The present invention also provides a diamond substrate comprising a foundation and a diamond layer formed on the surface of the foundation, wherein a back surface of the foundation has opening.

In such a diamond substrate, the defects are sufficiently reduced, and the internal stress, which is created as the crystal growth, and the thermal stress, which is created when the foundation is composed of a different kind of material, are reduced. Accordingly, it is possible to suppress warpage of the substrate or generation of a crack.

The present invention also provides a diamond substrate comprising at least one surface being composed of diamond, wherein the whole surface of at least one surface is composed of at least one of lateral grown diamond and diamond grown from the lateral grown diamond.

In such a diamond substrate, the defects are sufficiently reduced, and the stress is decreased.

Advantageous Effects of Invention

The present invention can provide a high-quality diamond substrate with few defects (including dislocation defects) and low stress. By using such a diamond substrate, it is possible to produce a semiconductor device which shows excellent property. When a different kind of material is used for the foundation to heteroepitaxially grow diamond, it is also possible to enlarge the area of a diamond substrate.

DESCRIPTION OF EMBODIMENTS

As described above, it has been desired for a method for manufacturing a diamond substrate that can sufficiently reduce defects (including dislocation defects), a high-quality diamond substrate and a high-quality freestanding diamond substrate in which defects are sufficiently reduced.

The inventors have found that a high-quality diamond substrate with the defects being sufficiently reduced can be manufactured by the following method for manufacturing a diamond substrate of the present invention.

That is, the present invention provides a method for manufacturing a diamond substrate, comprising:

a first step of preparing patterned diamond on a foundation surface, a second step of growing diamond from the patterned diamond prepared in the first step to form the diamond in a pattern gap of the patterned diamond prepared in the first step, a third step of removing the patterned diamond prepared in the first step to form a patterned diamond composed of the diamond formed in the second step, and a fourth step of growing diamond from the patterned diamond formed in the third step to form the diamond in a pattern gap of the patterned diamond formed in the third step.

Hereinafter, the embodiments of the present invention will be described with referring to Figures, but the present invention is not limited thereto. It is to be noted that the inventive method for manufacturing a diamond substrate includes at least four steps described below, but another step can be added as needed.

Figure 1:
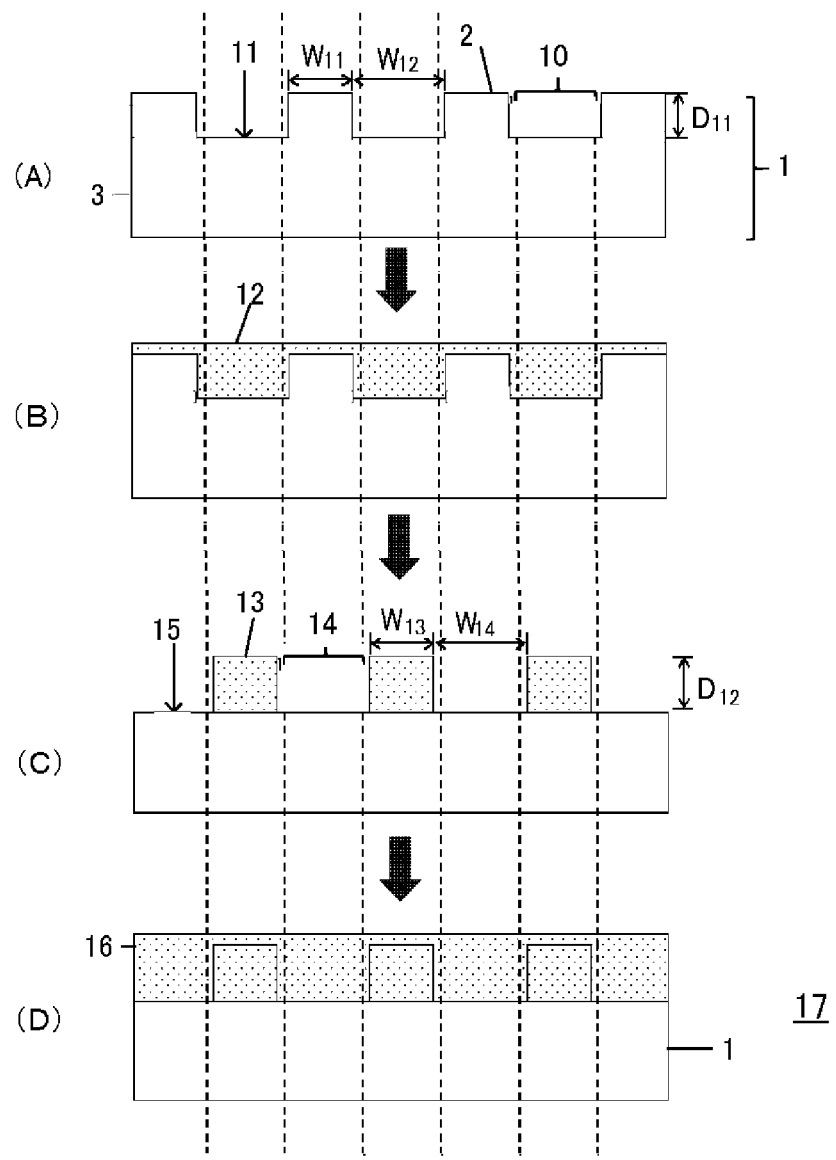
FIG. 1 is a schematic view showing a method for manufacturing a diamond substrate of the present invention (Example 2).
Figure 3:
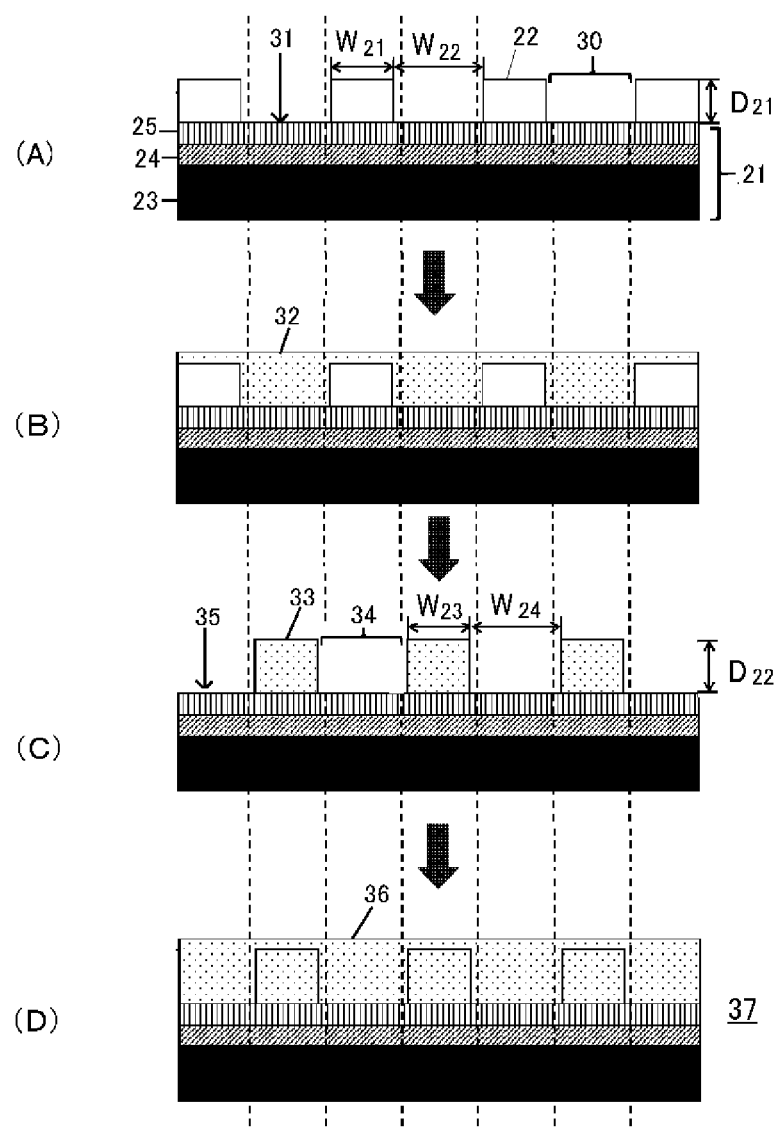
FIG. 3 is a schematic view showing another method for manufacturing a diamond substrate of the present invention (Example 1).

In the first step, patterned diamond 2 or 22 is prepared on the surface of the foundation 1 or 21 (a foundation surface) (FIG. 1 (A), FIG. 3 (A)).

The material for composing the foundation 1 and 21 is not particularly limited. When the foundation surface is composed of diamond 3 as in FIG. 1, a diamond substrate is manufactured by homoepitaxial growth.

Illustrative examples of such a foundation 1 include diamond 3 such as diamond synthesized by an HPHT method, homoepitaxial diamond, and heteroepitaxial diamond. Particularly, a diamond substrate with even fewer defects can be manufactured by using diamond having relatively few defects such as diamond synthesized by an HPHT method and homoepitaxial diamond as a foundation.

On the other hand, the foundation surface is composed of a different kind of material other than diamond as shown in FIG. 3, a diamond substrate is manufactured by heteroepitaxial growth.

As the different kind of material for composing the foundation surface, it is preferable that the material be a cubic crystal like diamond, have small lattice mismatch with diamond, and do not form carbide through reaction with carbon. Illustrative examples of the material to meet these conditions include platinum group such as rhodium (Rh), palladium (Pd), iridium (Ir), and platinum (Pt).

Incidentally, the lattice parameter of diamond is 3.57 Å, and accordingly, the lattice mismatch with Rh (lattice parameter: 3.72 Å) is 4.2%, the lattice mismatch with Ir (lattice parameter: 3.84 Å) is 7.6%, and the lattice mismatch with Pt (lattice parameter: 3.92 Å) is 9.8%. It is preferable that the lattice mismatch between diamond and the different kind of material composing the foundation is 10% or less. In view of not forming carbide through reaction with carbon, Ir is preferable.

Illustrative examples of the foundation 21 include a foundation in which the middle layer 24 composed of material selected from single crystal magnesium oxide (MgO), single crystal strontium titanate ($SrTiO_3$), α-alumina ($Al_2O_3$), and yttria-stabilized zirconia (YSZ) is prepared on the silicon (Si) substrate 23; and the top layer 25 composed of material selected from iridium (Ir), rhodium (Rh), and platinum (Pt) is prepared on the middle layer.

It is also possible to intervene one or more layers (not shown in FIGs.) composed of material selected from gold (Au), platinum (Pt), titanium (Ti), chromium (Cr), iridium (Ir), rhodium (Rh), silicon (Si), and silicon oxide ($SiO_2$) between the silicon (Si) substrate 23 and the middle layer 24.

It is possible to obtain a large-area diamond substrate easily and at relatively low cost by heteroepitaxial growth. Accordingly, when heteroepitaxial growth is applied to the present invention, a high-quality and large-area diamond substrate can be manufactured.

The method for preparing the patterned diamond 2 and 22 on the foundation surface is not limited either. Incidentally, "patterned" in the present invention means a pattern formed of ruggedness.

When the foundation is composed of diamond, diamond 3 of the foundation surface can be processed into patterned diamond 2, for example, by a known method such as photolithography and electron beam lithography (FIG. 1 (A)).

When the foundation is composed of a different kind of material, first, diamond is grown on the foundation surface by a known method such as microwave plasma CVD, direct current plasma CVD, hot-filament CVD, and arc discharge plasma jet CVD. Then, the patterned diamond 22 can be prepared on the foundation surface by processing the diamond grown on the foundation surface to a patterned shape by a method such as photolithography and electron beam lithography (FIG. 3 (A)).

Even when the foundation surface is composed of diamond, it is also possible to grow diamond on the foundation surface by the same process, and to process the grown diamond to a patterned shape to prepare patterned diamond on the foundation surface.

It is possible to select any pattern shape of the patterned diamond 2 and 22 prepared on a foundation surface. For example, it can be a pattern in which plural of diamonds each having line shape, rectangular dot shape, circular dot shape, etc. are arranged.

In this case, it is also possible to select any position, any size, any thickness, and any crystal orientation of each patterned diamond 2 and 22. However, it is preferable that the ratio D/W of a depth D ($D_{11}$ in FIG. 1, $D_{21}$ in FIG. 3) to a width W ($W_{12}$ in FIG. 1, $W_{22}$ in FIG. 3) of each pattern gap 10 and 30 of the patterned diamond 2 and 22 be 0.1 or more, more preferably 0.5 or more. Incidentally, $W_{11}$ in FIG. 1 and $W_{21}$ in FIG. 3 are the widths of the convex portion of the patterned diamond 2 and 22. This makes it possible to fill each pattern gaps 10 and 30 relatively early in the second step. Accordingly, even when an abnormal growth particle is generated from the pattern gap, it rarely influences the formed diamond surface. Incidentally, "pattern gap" in the present invention means a gap between the convex portions of patterned diamond.

The bottom portions 11 and 31 of the pattern gaps 10 and 30 may be composed of diamond or a different kind of material. Materials such as MgO, however, are etched by hydrogen ($H_2$)/methane ($CH_4$) plasma of CVD when diamond is formed in a pattern gap in the second step. Accordingly, materials such as Ir are preferable.

Especially when the bottom portion of a pattern gap is composed of a different kind of material, a foreign substance can adhere on the wall of the patterned diamond 2 and 22 prepared on the foundation surface in a step of processing the diamond into a patterned shape. In some cases, a foreign substance caused by $SiO_2$ used as a mask can adhere. It is preferable to remove these foreign substances adhered onto the wall of the patterned diamond prepared on the foundation surface, before the second step. Such removal of a foreign substance adhered onto the diamond wall can suppress generation of abnormal growth particles in the second step. The removal of a foreign substance can be performed by selective etching, for example.

For example, when a foreign substance such as Ir or $SiO_2$ is adhering on a wall of the patterned diamond 2 and 22 prepared on the foundation surface, it can be removed by etching with $CF_4$ plasma.

It is also possible to remove at least a part of each bottom portion 11 and 31 of the pattern gaps 10 and 30 of the patterned diamond prepared in the first step together with the foundation, and to pierce it thereby, as needed.

When the foundation surface is composed of a different kind of material other than diamond, at least a part of the bottom portion 31, which are bottoms of the pattern gap 30 of the patterned diamond prepared in the first step, may be prepared below the foundation surface, by removing a part of the foundation too. In this case, it is possible to determine any value as the depth from each foundation surface to each bottom portion 31 of the pattern gap 30.

This makes it possible to relax internal stress and thermal stress, which is created when the foundation is composed of a different kind of material. As a method to remove the bottom portion together with the foundation, etching can be mentioned, for example.

In the second step, diamond is grown from the patterned diamond 2 or 22 prepared in the first step to form the diamond 12 or 32 in the pattern gap 10 or 30 of the patterned diamond 2 or 22 prepared in the first step (FIG. 1 (B), FIG. 3 (B)).

The method for growing the diamond 12 or 32 from the patterned diamond prepared in the first step can be selected from a known method such as microwave plasma CVD, direct current plasma CVD, hot-filament CVD, and arc discharge plasma jet CVD.

In this case, diamond is laterally grown from the patterned diamond as a nucleus (ELO: Epitaxial Lateral Overgrowth). Accordingly, diamond 12 or 32 with few defects can be formed in the pattern gap.

The diamond does not have to be formed so as to fill the whole pattern gaps.

When the diamond 12 or 32 is grown in the second step in such a way that the growth rate from the upper portion of the patterned diamond is faster than that from the lower portion thereof, a void can be formed in the bottom portion of the pattern gap. Forming such a void can relax stress, especially thermal stress created when the foundation is composed of a different kind of material, and is preferable thereby. The void to be formed can be a void having a nearly triangle shape cross-section of a side 0.01 to 20 μm, for example.

As a specific method for adjusting the growth rate at the lower portion and the upper portion of the patterned diamond, it is possible to adjust the concentration and pressure of source gas (e.g., methane), input power, etc. to adjust the ratio of the growth rates in respective crystal orientations.

Then, in the third step, the patterned diamond 2 or 22 prepared in the first step is removed to form a patterned diamond 13 or 33 composed of the diamond formed in the second step (FIG. 1 (C), FIG. 3 (C)). This step can be performed by using a known method such as photolithography or electron beam lithography.

In this step, it is not necessary to remove the whole patterned diamond 2 or 22 prepared in the first step. It is also possible to remove a part of the diamond 12 or 32 formed in the second step, as needed.

In this case, it is preferable that the diamond 12 or 32 formed in the second step is removed to a position which is 5 μm or more away from a boundary with the patterned diamond 2 or 22 prepared in the first step. This makes it possible to grow a higher quality diamond in the fourth step. In view of production efficiency and production cost, the region to be removed is preferably limited to a position which is 30 μm or less away from a boundary with the patterned diamond 2 or 22 prepared in the first step.

In the third step, it is possible to select any pattern shape of the patterned diamond 13 or 33 as in the first step. For example, it can be a pattern in which plural of diamonds each having line shape, rectangular dot shape, circular dot shape, etc. are arranged.

In this case, it is also possible to select any position, any size, any thickness, and any crystal orientation of each patterned diamond 13 and 33. However, it is preferable that the ratio D/W of a depth D ($D_{12}$ in FIG. 1, $D_{22}$ in FIG. 3) to a width W ($W_{14}$ in FIG. 1, $W_{24}$ in FIG. 3) of each pattern gap 14 and 34 of the patterned diamond 13 and 33 be 0.1 or more, more preferably 0.5 or more. Incidentally, $W_{13}$ in FIG. 1 and $W_{23}$ in FIG. 3 are the widths of the convex portion of the patterned diamond 13 and 33. This makes it possible to fill each pattern gap 14 and 34 relatively early in the fourth step. Accordingly, even when an abnormal growth particle is generated from each pattern gap 14 and 34, it rarely influences the formed diamond surface.

The bottom portions 15 and 35 of the pattern gaps 14 and 34 may be composed of diamond or a different kind of material. Materials such as MgO, however, are etched by hydrogen ($H_2$)/ methane ($CH_4$) plasma of CVD when diamond is formed in a pattern gap in the fourth step. Accordingly, materials such as Ir are preferable.

Especially when the bottom portion of a pattern gap is composed of a different kind of material, a foreign substance can adhere on the wall of the patterned diamond in a step of processing the diamond into a patterned shape. In some cases, a foreign substance caused by $SiO_2$ used as a mask can adhere. It is preferable to remove these foreign substances adhered onto the diamond wall, before the fourth step. By removing a foreign substance adhered onto the diamond wall can suppress generation of abnormal growth particles in the fourth step. The removal of a foreign substance can be performed by selective etching, for example.

For example, when Ir or $SiO_2$ is adhering on a diamond wall, it can be removed by etching with $CF_4$ plasma.

It is also possible to pierce at least a part of each bottom portion 15 and 35 of the pattern gap 14 and 34 of the patterned diamond 13 and 33 formed in the third step, as needed.

When the foundation surface is composed of a different kind of material other than diamond, at least a part of the bottom portion 35, which are bottoms of the pattern gap 34 of the patterned diamond 33 formed in the third step, may be prepared below the foundation surface, by removing a part of the foundation too.

This makes it possible to relax internal stress and thermal stress, which is created when the foundation is composed of a different kind of material.

In the fourth step, diamond is grown from the patterned diamond 13 or 33 formed in the third step to form the diamond 16 or 36 in the pattern gap 14 or 34 of the patterned diamond 13 or 33 formed in the third step (FIG. 1 (D), FIG. 3 (D)).

In the fourth step, the method for growing the diamond from the patterned diamond formed in the third step can be selected from a known method such as microwave plasma CVD, direct current plasma CVD, hot-filament CVD, and arc discharge plasma jet CVD as in the second step.

In this case, diamond is laterally grown from the patterned diamond as a nucleus (ELO: Epitaxial Lateral Overgrowth). Accordingly, diamond with few defects is formed in the pattern gap.

In the fourth step, the diamond also does not have to be formed so as to fill the whole pattern gaps 14 and 34. It is preferable to form a void in the bottom portion 15 and 35 of each pattern gap. In each of the second and fourth steps, formation of such a void can relax stress, especially thermal stress created when the foundation is composed of a different kind of material.

The present invention can manufacture the diamond substrate 17 and 37 in which the whole surface is composed of lateral grown diamond and/or diamond grown from the lateral grown diamond through the steps from the first to the fourth.

That is, the present invention provide a diamond substrate in which at least one surface is composed of diamond, and the whole surface of at least one surface is composed of at least one of lateral grown diamond and diamond grown from the lateral grown diamond.

The whole surface does not have to be lateral grown diamond and/or diamond grown from the lateral grown diamond before the fourth step. It is also possible to manufacture the diamond substrate in which the whole surface of at least one surface is composed of at least one of lateral grown diamond and diamond grown from the lateral grown diamond by repeating the formation and growth of patterned diamond according to the third step and the fourth step for plural times.

It is also possible to further reduce the defects by forming the whole surface from at least one of a lateral grown diamond and diamond grown from the lateral grown diamond, followed by repeating the formation and growth of patterned diamond according to the third step and the fourth step for plural times. This process can form more voids, and lower stress can be expected thereby.

The diamond substrate manufactured by the present invention may be used with the foundation being remained, or may be used as a freestanding substrate with the foundation being removed.

When the foundation of a diamond substrate is removed to produce a freestanding substrate, the thickness of the freestanding substrate is preferably 50 μm or more and 2000 μm or less. The freestanding substrate with a thickness of 50 μm or more is easy to be handled and does not have a risk of breakage in its production process or in a device production process using the diamond substrate, and is preferable thereby.

On the other hand, when the thickness of the freestanding substrate is 2000 μm or less, the time for forming the diamond does not become longer in itself, and the time for polishing process can be shortened since the surface of the diamond substrate does not have large ruggedness. Accordingly, the production cost can be reduced. It is also possible to suppress warpage of the substrate, and to suppress generation of a crack and breakage.

When the foundation of the diamond substrate is remained to make a substrate structure including the foundation, the diamond layer does not have to be formed needlessly thick. Considering the time for manufacturing the substrate and the influence of internal stress, it is preferable that the thickness from the foundation surface to the surface of the substrate be 300 μm or less.

Figure 5:
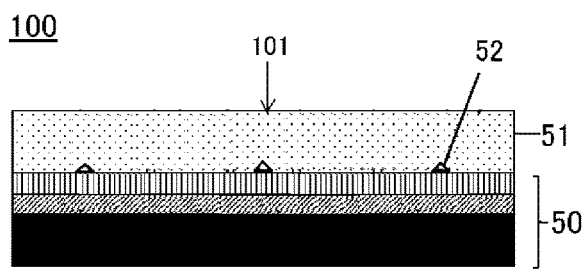
FIG. 5 is a cross sectional view showing an example of a diamond substrate of the present invention.

When a void is formed in the bottom portion of a pattern gap in the second and/or the fourth step, it is possible to obtain a diamond substrate 100 in which at least one surface 101 is composed of diamond, and the inner portion contains voids 52 as shown in FIG. 5.

In this case, the inventive diamond substrate 100 can comprise the foundation 50 and the diamond layer 51 formed on the surface of the foundation 50, and can contain the void(s) 52 on the boundary between the foundation 50 and the diamond layer 51.

When the foundation 50 is removed to make a freestanding substrate, a diamond substrate whose one surface contains a void 52 can be obtained.

In the inventive diamond substrate containing a void in the inner portion thereof, and in the inventive freestanding diamond substrate whose one surface contains a void, defects such as dislocation defects are sufficiently reduced. Moreover, the stress is reduced, and accordingly, warpage of the substrate and generation of a crack can be suppressed.

When the bottom portion of the pattern gap is pierced in the first and/or the third step, it is possible to obtain a diamond substrate, comprising a foundation and a diamond layer formed on the surface of the foundation, wherein a back surface of the foundation has an opening.

In this inventive diamond substrate having an opening on the surface of the foundation, the defects are sufficiently reduced, and the internal stress created as the crystal growth and the thermal stress are reduced. Accordingly, it is possible to suppress warpage of the substrate and generation of a crack.

It is preferable that the surface of a diamond substrate manufactured by the present invention is composed of single crystal diamond.

Onto the surface of a diamond substrate manufactured by the present invention, it is also possible to laminate a material selected from any of p-type diamond doped with an impurity such as boron (B), n-type diamond doped with an impurity such as phosphorous (P), diamond without being doped. Such a structure makes it possible to operate the substrate as a semiconductor device.

EXAMPLES

Hereinafter, the present invention will be specifically described using Examples of the present invention and a Comparative Example, but the present invention is not limited to thereto.

Example 1

A diamond substrate was manufactured by the method shown in FIG. 3.

First, a patterned diamond 22 was prepared on the surface of a foundation 21 as shown in FIG. 3 (A) (the first step). Specifically, the patterned diamond 22 was prepared on the surface of the foundation 21 through the steps shown in FIG. 4 (*a*) to FIG. 4 (*f*).

The foundation 21 was produced, and a diamond layer 26 was formed on the foundation 21 as follows (FIG. 4 (*a*)).

First, a double-side polished single crystal silicon (Si) substrate 23 having a diameter of 10.0 mm and a thickness of 1.0 mm, with the surface having a (100) plane was prepared. On the one side of the prepared single crystal silicon substrate 23, a layer 24 composed of single crystal MgO was formed by electron beam deposition. In this case, the single crystal MgO layer 24 was epitaxially grown until the thickness reached to 1 μm under the conditions of 900° C. of the substrate temperature in vacuum. On this single crystal MgO layer 24, a layer 25 composed of Ir was formed. The Ir layer 25 was formed by using a radio-frequency (RF) magnetron sputtering method (13.56 MHz) with targeting at Ir having a diameter of 6 inches (150 mm), a thickness of 5.0 mm, and purity of 99.9% or higher. The substrate on which the single crystal MgO layer 24 had been formed was heated to 800° C., and after it was confirmed that a base pressure became $6\times10^{-7}$ Torr (about $8.0\times10^{-5}$ Pa) or lower, 10 sccm of Ar gas was introduced. After the pressure became $5\times10^{-2}$ Torr (about 6.7 Pa) by adjusting aperture of a valve connected to an exhaust system, film formation was performed for 15 minutes by inputting RF power of 1000 W. The obtained Ir layer 25 had a thickness of 0.7 μm.

Thus obtained laminate, in which the single crystal MgO layer 24 and the Ir layer 25 had been laminated on the single crystal silicon substrate 23, was used as the foundation 21 in Example 1.

Then, the foundation 21 was subjected to pre-treatment (bias treatment) in order to form diamond nuclei. The foundation was set on a planar electrode having a diameter of 15 mm, with the Ir layer 25 side facing upwards. After it was confirmed that the base pressure became $1\times10^{-6}$ Torr (about $1.3\times10^{-4}$ Pa) or lower, 500 sccm of hydrogen-diluted methane ($CH_4/(CH_4+H_2)$=5.0 vol. %) was introduced. After the pressure became 100 Torr (about $1.3\times10^4$ Pa) by adjusting aperture of the valve connected to the exhaust system, a negative voltage was applied to an electrode at the substrate side to expose the foundation to plasma for 90 seconds, and thereby the surface of the foundation was subjected to bias treatment.

Subsequently, a diamond layer 26 was heteroepitaxially grown on the foundation surface using a direct current plasma CVD method. The bias-treated foundation 21 was set inside a chamber of a direct current plasma CVD apparatus, and after exhausting was performed using a rotary pump until the base pressure became $10^{-3}$ Torr (about $1.3\times10^{-1}$ Pa) or lower, 1000 sccm of hydrogen-diluted methane ($CH_4/(CH_4+H_2)$=5.0 vol. %) was introduced as a source gas. After the pressure inside the chamber became 110 Torr (about $1.5\times10^4$ Pa) by adjusting aperture of the valve connected to the exhaust system, film formation was performed for 2 hours by sending a direct current of 2.0 A. The temperature of the foundation during film formation, which was measured by a pyrometer, was 950° C.

The obtained diamond layer 26 was a complete continuous film which did not have delamination on the whole surface of the substrate with a diameter of 10 mm, and had a film thickness of 10 μm. This diamond layer was measured by X-ray diffraction (an incident X-ray wavelength of 1.54 Å) to reveal that the rocking curve half width of the diffracted intensity peak at 2θ=119.5°, assigned to diamond (004), was 720 arcsec (about 0.2°).

The etch-pit density was also evaluated. The surface of the diamond layer 26 was subjected to plasma treatment under the conditions of $H_2$ gas 100 vol. %. 0.8 Pa, 2200 W, and 1 hour by using a microwave (2.45 GHz) plasma CVD apparatus, and then the etch-pit density was measured by SEM observation to be $8\times10^8$ ($cm^{-2}$).

Then, the diamond layer 26 was subjected to patterning. First, 1000 nm of $SiO_2$ film 27 was formed on the diamond layer by an RF plasma CVD method using tetraethyl orthosilicate (TEOS) as a raw material (FIG. 4 (*b*)). Onto this $SiO_2$ film 27, a resist pattern 28 was formed (FIG. 4 (*c*)). Subsequently, onto the $SiO_2$ film 27 on which the resist pattern 28 had been formed, a titanium (Ti) film and a gold (Au) film were formed successively and subjected to liftoff, thereby forming the $SiO_2$ film 27 and the titanium (Ti)/gold (Au) pattern 29 successively on the diamond layer 26 (FIG. 4 (*d*)). Then, $SiO_2$ etching was performed by using $CF_4$ gas to make a hard mask for diamond etching (FIG. 4 (*e*)).

Figure 4:
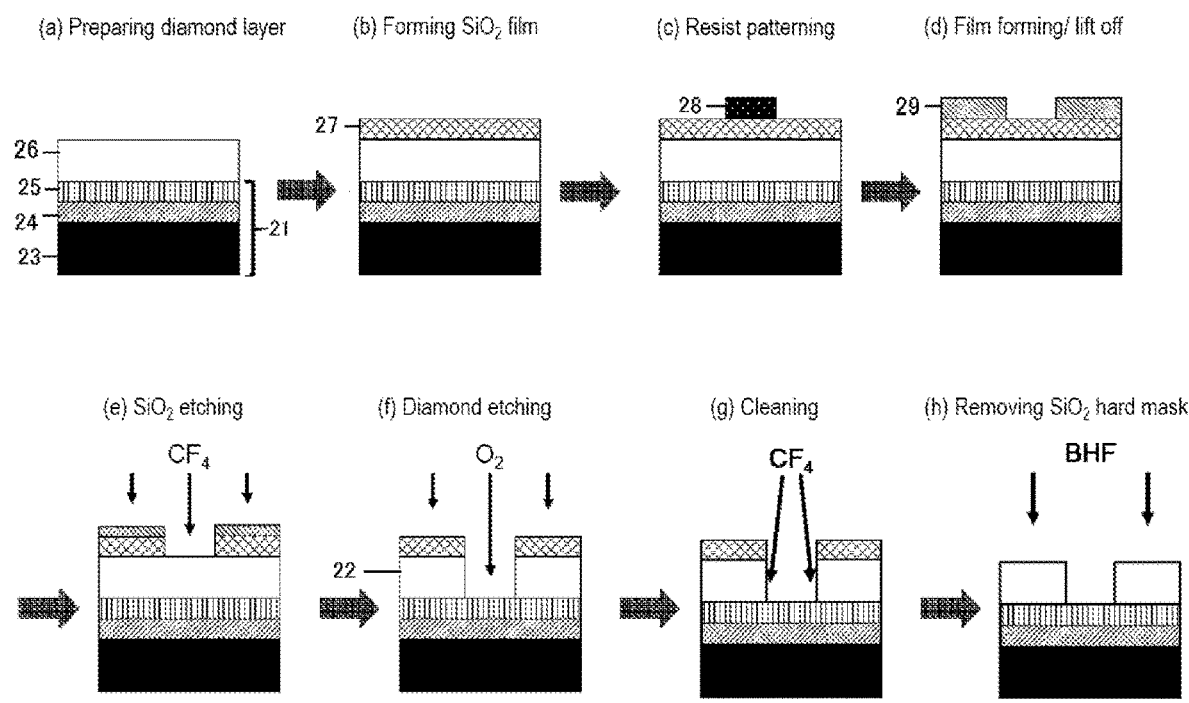
FIG. 4 is a schematic view showing lithography and so on performed in the first step in another method for manufacturing a diamond substrate of the present invention (Example 1).

Next, the diamond layer was etched under the conditions of $O_2$ gas 100 vol. %, 2.0 Pa, 500 W, and 900 seconds by using an induced combination plasma etching equipment (FIG. 4 (*f*)). In this manner, the patterned diamond 22 was prepared on the surface of the foundation (FIG. 3 (A)).

In this case, the patterned diamond 22 in FIG. 3 (A) had a pattern in which 50 μm square (i.e., $W_{21}$ is 50 μm) rectangular dot diamonds were arranged, and a width of the pattern gap $W_{22}$ of 70 μm. In other words, this was a pattern in which plural grooves were provided in parallel with each other on the diamond layer, and other plural grooves being in parallel with each other were provided perpendicular to the foregoing grooves. The directions of the grooves were two directions which were perpendicular with each other, and one of them was the same direction with the [011] orientation of the diamond layer.

The depth $D_{21}$ of the pattern gap was 10 μm, and the ratio ($D_{21}/W_{22}$) of the depth $D_{21}$ to the width $W_{22}$ of the pattern gap was 0.14 in this case. The bottom portion of the pattern gap was in a state in which Ir of the foundation was exposed.

Then, the obtained patterned diamond was cleaned by plasma treatment (FIG. 4 (g)). The treatment was performed under the conditions of $CF_4$ gas 100 vol. %, 2.0 Pa, 500 W, and 650 seconds by using an induced combination plasma etching equipment. This procedure could remove foreign substances probably due to Ir adhered on the wall of the patterned diamond.

After the cleaning, the hard mask of $SiO_2$ was removed with buffered hydrofluoric acid, and cleaned with a thermal mixed acid (FIG. 4 (h)).

Next, as the second step, the diamond 32 was grown from the patterned diamond 22, which had been prepared on the foundation surface, by a microwave plasma CVD method, in the pattern gap 30 of the patterned diamond prepared in the first step (FIG. 3 (B)).

The substrate provided with the patterned diamond 22 was set inside a chamber of a microwave plasma CVD apparatus, and after exhausting was performed using a rotary pump and a turbo molecular pump until the pressure became $7 \times 10^{-8}$ Torr (about $9.3 \times 10^{-6}$ Pa), 500 sccm of hydrogen-diluted methane ($CH_4/(CH_4+H_2)$=5.0 vol. %) was introduced as a source gas. After the pressure inside the chamber became 110 Torr (about $1.5 \times 10^4$ Pa) by adjusting aperture of the valve connected to the exhaust system, film formation was performed for 18 hours by applying microwave power of 3000 W. The temperature of the substrate during film formation, which was measured by a pyrometer, was 1035° C.

In the obtained diamond layer, the pattern gaps were filled. In this case, the thickness from the foundation surface to the surface of the substrate was 103 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the portion grown on the patterned diamond showed $1 \times 10^8$ ($cm^{-2}$), on the other hand, the portion of the pattern gap showed $3 \times 10^6$ ($cm^{-2}$), that is, the etch-pit density was decreased about two orders of magnitude.

On SEM observation of the cross section of this substrate, a void having a nearly triangle shape cross-section with a side of 5 μm was observed in the vicinity of the center of a position where had been the patterned gap such that it touched with the boundary between the Ir layer and the diamond layer.

In order to evaluate the stress of the diamond substrate, the change of warpage of the back surface of the substrate before and after the formation of the diamond layer was measured by using an optical interference or a contact type measuring device. Subsequently, this measured value was divided by an increment of the film thickness before and after the formation of the diamond layer, and the calculated value was defined to the evaluation value of stress of the diamond substrate. The evaluation value in this case was $21 \times 10^{-2}$.

Then, the surface of the obtained diamond substrate was polished. After the polishing, the thickness from the foundation surface to the surface of the substrate was 71 μm, and the surface roughness RMS was 0.3 nm (AFM measurement, in a region of 10 μm square).

Subsequently, as the third step, the second patterning of the diamond layer was performed by the same process as in the first patterning to form patterned diamond 33 composed of the diamond 32 formed in the second step (FIG. 3 (C)). The pattern shape in this case was a pattern in which 50 μm square (i.e., $W_{23}$ was 50 μm) rectangular dot diamonds were arranged, and a width of the pattern gap $W_{24}$ was 70 μm as in the shape of the first pattern. Provided that, the position of the pattern was translated in parallel along the [011] orientation of the diamond layer by 60 μm with respect to the first pattern.

That is, in this case, the diamond 32 formed in the second step was removed to a position which was 10 μm away from the boundary with the patterned diamond 22 prepared in the first step.

Then, as the fourth step, diamond 36 was grown from the patterned diamond 33, using the same method as in growing the diamond from the patterned diamond prepared on the foundation surface, in the pattern gap 34 of the patterned diamond formed in the third step (FIG. 3 (D)). In the obtained diamond layer, the pattern gaps were filled. In this case, the thickness from the foundation surface to the surface of the substrate was 164 μm.

This diamond layer was measured by X-ray diffraction (an incident X-ray wavelength of 1.54 Å) to reveal that the rocking curve half value width of the diffracted intensity peak at 2θ=119.5°, assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the both of the portion grown on the patterned diamond and the portion of the pattern gap showed $3 \times 10^6$ ($cm^{-2}$), that is, the etch-pit densities were low in the whole surface of the diamond substrate 37.

On SEM observation of the cross section of the manufactured diamond substrate 37, a void having a nearly triangle shape cross-section with a side of 5 μm was also observed in the vicinity of the center of a position where had been the second patterned gap such that it touched with the boundary between the Ir layer and the diamond layer.

In order to evaluate the stress of the diamond substrate, the (change of warpage of the back surface of the substrate)/(increment of the film thickness) before and after the formation of the diamond layer was measured to give the value of $15 \times 10^{-2}$.

Example 2

A diamond substrate was manufactured by the method shown in FIG. 1.

First, a patterned diamond 2 was prepared on the surface of a foundation 1 as shown in FIG. 1 (A) (the first step). Specifically, the patterned diamond 2 was prepared through the steps shown in FIG. 2 (a) to FIG. 2 (f).

In the beginning, a double-side polished heteroepitaxial diamond substrate (freestanding substrate) 6 having a diameter of 5.0 mm and a thickness of 0.5 mm, with the surface having a (100) plane was prepared. This was cleaned with a thermal mixed acid, and used as a foundation 1 (FIG. 2 (a)).

Then, patterning was performed on the foundation composed of diamond by the same process as in Example 1. First, 1000 nm of $SiO_2$ film 7 was formed on the diamond layer by an RF plasma CVD method using tetraethyl orthosilicate (TEOS) as a raw material (FIG. 2 (b)). Onto this $SiO_2$ film 7, a resist pattern 8 was formed (FIG. 2 (c)). Subsequently, onto the $SiO_2$ film 7 on which the resist pattern 8 had been formed, a titanium (Ti) film and a gold (Au) film were formed successively and subjected to liftoff, thereby forming the $SiO_2$ film 7 and the titanium (Ti)/gold (Au) pattern 9 successively on the diamond substrate 6 (FIG. 2 (d)). Then, $SiO_2$ etching was performed by using $CF_4$ gas to make a hard mask for diamond etching (FIG. 2 (e)).

Figure 2:
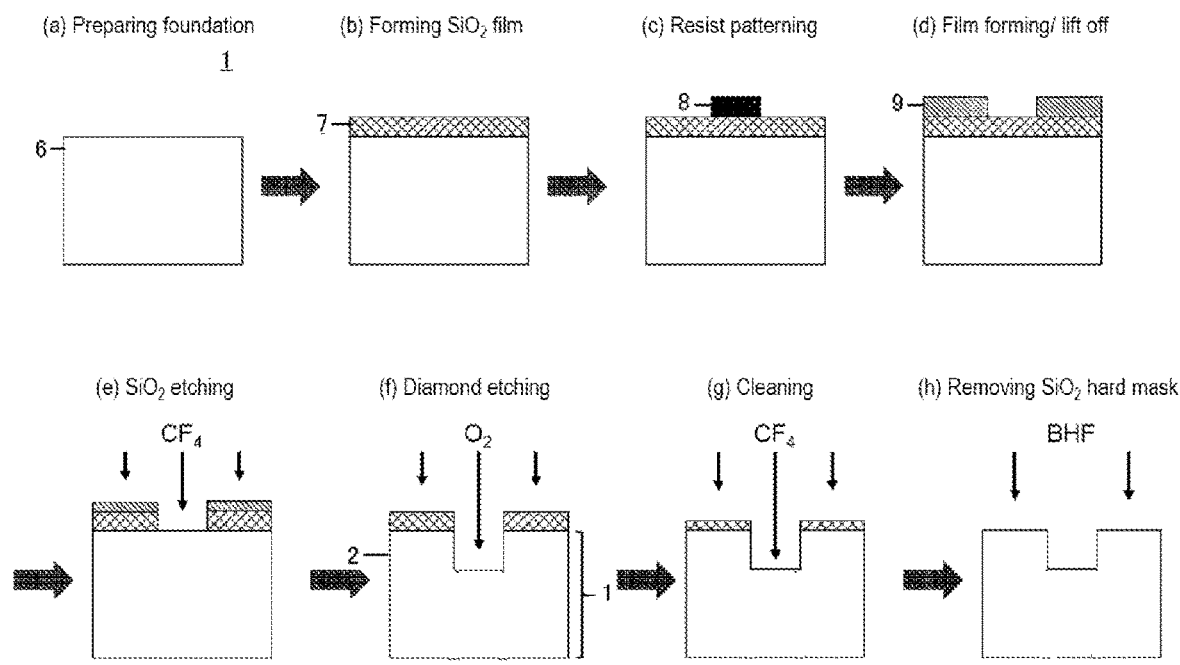
FIG. 2 is a schematic view showing lithography and so on performed in the first step in a method for manufacturing a diamond substrate of the present invention (Example 2).

Next, the diamond layer was etched under the conditions of $O_2$ gas 100 vol. %, 2.0 Pa, 500 W, and 900 seconds by using an induced combination plasma etching equipment (FIG. 2 (f)). In this manner, the patterned diamond 2 was prepared on the surface of the foundation (FIG. 1 (A)).

In this case, the pattern shape in FIG. 1 (A) was a pattern in which 50 μm square (i.e., $W_{11}$ is 50 μm) rectangular dot diamonds were arranged, and a width of the pattern gap $W_{12}$ was 70 μm. In other words, this was a pattern in which plural grooves were provided in parallel with each other on the diamond layer, and other plural grooves being in parallel with each other were provided perpendicular to the foregoing grooves. The directions of the grooves were two directions which were perpendicular with each other, and one of them was the same direction with the [011] orientation of the diamond layer.

The depth $D_{11}$ of the pattern gap of the patterned diamond 2 was adjusted to 10 μm, and accordingly, the ratio ($D_{11}/W_{12}$) of the depth $D_{11}$ to the width $W_{12}$ of the patterned diamond was 0.14 in this case.

Then, the obtained patterned diamond was cleaned by plasma treatment (FIG. 2 (g)). The treatment was performed under the conditions of $CF_4$ gas 100 vol. %, 2.0 Pa, 500 W, and 650 seconds by using an induced combination plasma etching equipment.

After the cleaning, the hard mask of $SiO_2$ was removed with buffered hydrofluoric acid, and cleaned with a thermal mixed acid (FIG. 2 (h)).

Next, as the second step, the diamond 12 was grown from the patterned diamond 2, which had been prepared on the foundation surface, by a microwave plasma CVD method in the pattern gap 10 of the patterned diamond prepared in the first step (FIG. 1 (B)).

The substrate provided with the patterned diamond 2 was set inside a chamber of a microwave plasma CVD apparatus, and after exhausting was performed using a rotary pump and a turbo molecular pump until the pressure became $7 \times 10^{-8}$ Torr (about $9.3 \times 10^{-6}$ Pa), 500 sccm of hydrogen-diluted methane ($CH_4/(CH_4+H_2)$=5.0 vol. %) was introduced as a source gas. After the pressure inside the chamber became 110 Torr (about $1.5 \times 10^4$ Pa) by adjusting aperture of the valve connected to the exhaust system, film formation was performed for 15 hours by applying microwave power of 3000 W. The temperature of the substrate during film formation, which was measured by a pyrometer, was 1050° C.

In the obtained diamond layer, the pattern gaps were filled. In this case, the thickness from the foundation surface to the surface of the substrate was 78 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the portion grown on the patterned diamond showed $2 \times 10^8$ ($cm^{-2}$), on the other hand, the portion of the pattern gap showed $4 \times 10^6$ ($cm^{-2}$), that is, the etch-pit density was decreased about two orders of magnitude.

The cross section of the substrate was observed under SEM to reveal that the portions where had been pattern gaps were entirely filled.

In order to evaluate the stress of the diamond substrate, the (change of warpage of the back surface of the substrate)/(increment of the film thickness) before and after the formation of the diamond layer was measured to give the value of $15 \times 10^{-2}$.

Then, the surface of the obtained diamond substrate was polished. After the polishing, the thickness from the foundation surface to the surface of the substrate was 56 μm, and the surface roughness RMS was 0.3 nm (AFM measurement, in a region of 10 μm square).

Subsequently, as the third step, the second patterning of the diamond layer was performed by the same process as in the first patterning to form patterned diamond 13 composed of the diamond formed in the second step (FIG. 1 (C)). The pattern shape in this case was a pattern in which 50 μm square (i.e., $W_{13}$ was 50 μm) rectangular dot diamonds were arranged, and a width of the pattern gap $W_{14}$ was 70 μm as in the shape of the first pattern. Provided that, the position of the pattern was translated in parallel along the [011] orientation of the diamond layer by 60 μm with respect to the first pattern. That is, in this case, the diamond formed in the second step was removed to a position which was 10 μm away from a boundary with the patterned diamond prepared in the first step.

Then, as the fourth step, diamond 16 was grown from the patterned diamond 13 by the same method as in growing the diamond from the patterned diamond prepared on the foundation surface (FIG. 1 (D)). In the obtained diamond layer, the pattern gaps were filled. In this case, the thickness from the foundation surface to the surface of the substrate was 134 μm.

This diamond layer was measured by X-ray diffraction (an incident X-ray wavelength of 1.54 Å) to reveal that the rocking curve half value width of the diffracted intensity peak at 2θ=119.5°), assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the portion grown on the patterned diamond showed $3 \times 10^6$ ($cm^{-2}$), and the portion of the pattern gap showed 4×10⁶ (cm⁻²), that is, the etch-pit densities were low in the whole surface of the diamond substrate.

The cross section of the obtained diamond substrate 17 was observed under SEM to reveal that the portions where had been pattern gaps were entirely filled.

In order to evaluate the stress of the diamond substrate, the (change of warpage of the back surface of the substrate)/(increment of the film thickness) before and after the formation of the diamond layer was measured to give the value of $10×10^{-2}$.

Comparative Example 1

First, a double-side polished single crystal silicon (Si) substrate having a diameter of 10.0 mm and a thickness of 1.0 mm, with the surface having a (100) plane was prepared.

On the one side of the prepared single crystal silicon substrate, a layer composed of single crystal MgO was formed by electron beam deposition. In this case, the single crystal MgO layer was epitaxially grown until the thickness reached to 1 μm under the conditions of 900° C. of the substrate temperature in vacuum. On this single crystal MgO layer, a layer composed of Ir was formed. The Ir layer was formed by using a radio-frequency (RF) magnetron sputtering method (13.56 MHz) with targeting at Ir having a diameter of 6 inches (150 mm), a thickness of 5.0 mm, and purity of 99.9% or higher. The substrate on which the single crystal MgO layer had been formed was heated to 800° C., and after it was confirmed that a base pressure became $6×10^{-7}$ Torr (about $8.0×10^{-5}$ Pa) or lower, 10 sccm of Ar gas was introduced. After the pressure became $5×10^{-2}$ Torr (about 6.7 Pa) by adjusting aperture of the valve connected to the exhaust system, film formation was performed for 15 minutes by inputting RF power of 1000 W. The obtained Ir layer had a thickness of 0.7 μm.

Thus obtained laminate, in which the single crystal MgO layer and the Ir layer were laminated on the single crystal silicon substrate, was used as the foundation in Comparative Example 1.

Then, the foundation was subjected to pre-treatment (bias treatment) in order to form diamond nuclei. The foundation was set on a planar electrode having a diameter of 15 mm, with the Ir layer side facing upwards. After it was confirmed that the base pressure became $1×10^{-6}$ Torr (about $1.3×10^{-4}$ Pa) or lower, 500 sccm of hydrogen-diluted methane (CH$_4$/(CH$_4$+H$_2$)=5.0 vol. %) was introduced. After the pressure became 100 Torr (about $1.3×10^4$ Pa) by adjusting aperture of the valve connected to the exhaust system, a negative voltage was applied to an electrode at the substrate side to expose the foundation to plasma for 90 seconds, and thereby the foundation surface was subjected to bias treatment.

Subsequently, a diamond layer was heteroepitaxially grown on the foundation surface using a direct current plasma CVD method. The bias-treated foundation was set inside a chamber of a direct current plasma CVD apparatus, and after exhausting was performed using a rotary pump until the base pressure became $10^{-3}$ Torr (about $1.3×10^{-1}$ Pa) or lower, 1000 sccm of hydrogen-diluted methane (CH$_4$/(CH$_4$+H$_2$)=5.0 vol. %) was introduced as a source gas. After the pressure inside the chamber became 110 Torr (about $1.5×10^4$ Pa) by adjusting aperture of the valve connected to the exhaust system, film formation was performed for 2 hours by sending a direct current of 2.0 A. The temperature of the foundation during film formation, which was measured by a pyrometer, was 950° C.

The obtained diamond layer was a complete continuous film which did not have delamination on the whole surface of the substrate with a diameter of 10 mm, and had a film thickness of 10 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 720 arcsec (about 0.2°).

The etch-pit density was also evaluated. The surface of the diamond layer was subjected to plasma treatment under the conditions of H$_2$ gas 100 vol. %. 0.8 Pa, 2200 W, and 1 hour by using a microwave (2.45 GHz) plasma CVD apparatus, and then the etch-pit density was measured by SEM observation to be $8×10^8$ (cm⁻²).

Then, the substrate on which the diamond nuclei had been formed was set inside a chamber of a microwave plasma CVD apparatus, and after exhausting was performed using a rotary pump and a turbo molecular pump until the pressure became $7×10^{-8}$ Torr (about $9.3×10^{-6}$ Pa), 500 sccm of hydrogen-diluted methane (CH$_4$/(CH$_4$+H$_2$)=5.0 vol. %) was introduced as a source gas. After the pressure inside the chamber became 110 Torr (about $1.5×10^4$ Pa) by adjusting aperture of the valve connected to the exhaust system, film formation was performed for 18 hours by applying microwave power of 3000 W. The temperature of the substrate during film formation, which was measured by a pyrometer, was 1035° C.

The obtained diamond layer was a complete continuous film which did not have delamination on the whole surface of the substrate with a diameter of 10 mm, and had a film thickness of 90 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 720 arcsec (about 0.2°).

The etch-pit density was also evaluated. The surface of the diamond layer was subjected to plasma treatment under the conditions of H$_2$ gas 100 vol. %. 0.8 Pa, 2200 W, and 1 hour by using a microwave (2.45 GHz) plasma CVD apparatus, and then the etch-pit density was measured by SEM observation to be $4×10^8$ (cm⁻²).

In order to evaluate the stress of the diamond substrate, the (change of warpage of the back surface of the substrate)/(increment of the film thickness) before and after the formation of the diamond layer was measured to give the value of $67×10^{-2}$.

On the basis of the foregoing results, it has been revealed that the inventive method for manufacturing a diamond substrate can give a high-quality diamond substrate with sufficiently reduced defects and low stress. It has been also revealed that in the inventive diamond substrate, defects are sufficiently reduced, and the stress is decreased.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A substrate comprising at least one surface composed of diamond,
   wherein the substrate is composed of a foundation and a diamond layer formed on a surface of the foundation, and contains a void on a boundary between the foundation and the diamond layer, and wherein the surface of the foundation is composed of a different kind of material other than diamond.

2. A substrate comprising a foundation and a diamond layer formed on a surface of the foundation, wherein a back surface of the foundation has an opening.

3. The substrate according to claim 2, wherein the surface of the foundation is composed of a different kind of material other than diamond.

4. A substrate comprising at least one surface being composed of diamond, wherein the whole surface of the at least one surface is composed of at least one of lateral grown diamond and diamond grown from the lateral grown diamond.

* * * * *